United States Patent [19]
Hsu

[11] Patent Number: 5,891,772
[45] Date of Patent: Apr. 6, 1999

[54] STRUCTURE AND MANUFACTURING METHOD FOR DRAM CAPACITORS

[75] Inventor: Chen-Chung Hsu, Taichung, Taiwan

[73] Assignee: United Microelectronics Corporation, Taiwan

[21] Appl. No.: 859,207

[22] Filed: May 20, 1997

[30] Foreign Application Priority Data

Mar. 22, 1997 [TW] Taiwan .................................. 86103625

[51] Int. Cl.⁶ ............................ H01L 21/70; H01L 27/00
[52] U.S. Cl. ........................ 438/254; 438/397; 257/309; 365/149
[58] Field of Search .................................. 438/254, 397; 365/149, 168; 257/309, 308

[56] References Cited

U.S. PATENT DOCUMENTS

| | | | |
|---|---|---|---|
| 5,434,812 | 7/1995 | Tseng ....................................... | 365/149 |
| 5,637,523 | 6/1997 | Fazan et al. ............................. | 438/397 |
| 5,672,534 | 9/1997 | Huang ..................................... | 438/254 |
| 5,701,264 | 12/1997 | Shrivastava et al. ................... | 257/309 |

FOREIGN PATENT DOCUMENTS

262587  5/1995  Taiwan .................................. 257/309

Primary Examiner—Donald L. Monin, Jr.
Attorney, Agent, or Firm—Rabin & Champagne, P.C.

[57] ABSTRACT

A structure and manufacturing method for DRAM capacitors includes providing a semiconductor substrate with a MOS transistor having a gate and source/drain regions formed thereon. A first insulating layer covers the semiconductor substrate. A multi-layered stack, with at least one pair of an alternately deposited second insulating layer followed by a third insulating layer, is formed above the first insulating layer. An opening is formed through the multi-layered structure and the first insulating layer exposing the source/drain region. Then, a plurality of trenches are formed on the sidewalls of the opening. A second conducting layer is formed over the exposed surfaces of the aforementioned layers. A pattern is defined on the second conducting layer so as to form a lower electrode structure. A dielectric layer is formed over the lower electrode layer. A third conducting layer is formed over the dielectric layer, and a pattern is defined on the third conducting layer to form the upper electrode structure.

11 Claims, 12 Drawing Sheets

STRUCTURE AND MANUFACTURING METHOD FOR DRAM CAPACITORS

BACKGROUND OF THE INVENTION

1. Field of Invention

This invention relates in general to a structure and manufacturing method for dynamic random-access-memory (DRAM) capacitors, and more particularly to the structure and manufacturing method for a stacked type capacitor as well as an improved version using a parallel combination of stacked and trench type capacitors.

2. Description of Related Art

Figure 1:
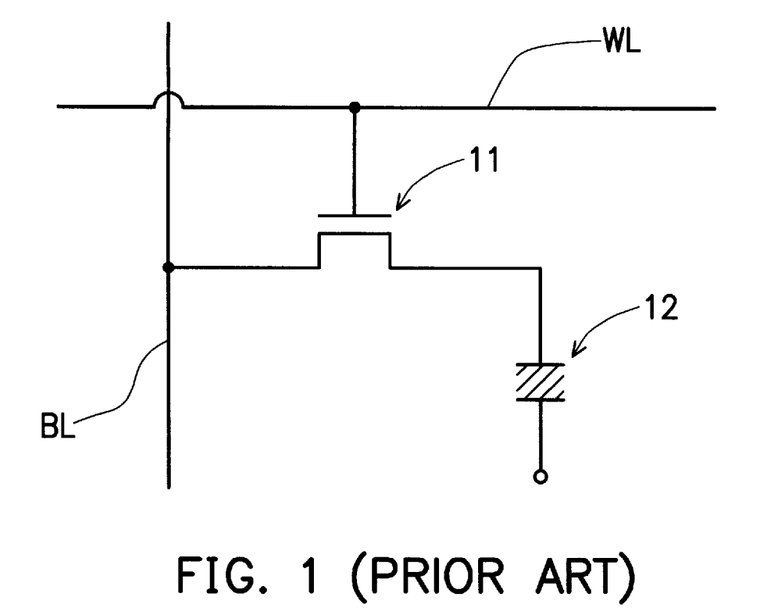
FIG. 1 is a circuit diagram for a DRAM cell.

DRAM is a kind of volatile memory whose digital signals are stored according to the charging state of the respective capacitors in each of the memory cells. FIG. 1 shows a conventional circuit diagram of a DRAM cell, which comprises a metal-oxide-semiconductor (MOS) transistor 11 with its gate connected to a word line (WL). One source/drain region is connected to a bit line (BL), while the other source/drain region is connected to ground via a capacitor 12. The capacitor 12 can be regarded as the heart for the storage of digital signals in a DRAM cell. When the charges stored in the capacitor 12 are large, the storage capacity for digital signals is increased. Furthermore, the signal read out from the memory by amplification circuits during a read operation will be less affected by noise. For example, soft errors generated by a-particles will be greatly reduced.

There are several methods to increase the charge storage capacity of the capacitor 12. For example, by increasing the surface area of the capacitor 12, the quantity of charges capable of being stored in the capacitor can be increased. The conventional stacked type capacitor (as shown in FIG. 2K) is one such structure for increasing the surface area of the capacitor in a DRAM memory cell.

FIGS. 2A through 2K are a series of cross-sectional views showing the manufacturing steps of a stacked type DRAM capacitor according to a Taiwan Patent No. 262587. First, referring to FIG. 2A, a semiconductor substrate 20 having a MOS transistor 22, a field oxide layer 26 and a conducting layer 27 already formed above is provided. The MOS transistor 22 includes a gate 23, source/drain regions 24 and spacers 25. Using a chemical vapor deposition (CVD) method, a first insulating layer 28 with a thickness of about 1000 Å to 3000 Å is then deposited covering the aforementioned layers. Thereafter, referring to FIG. 2B, the first insulating layer 28, one of the source/drain regions 24 and the semiconductor substrate 20 are sequentially etched to form a trench 29.

Figure 2A:
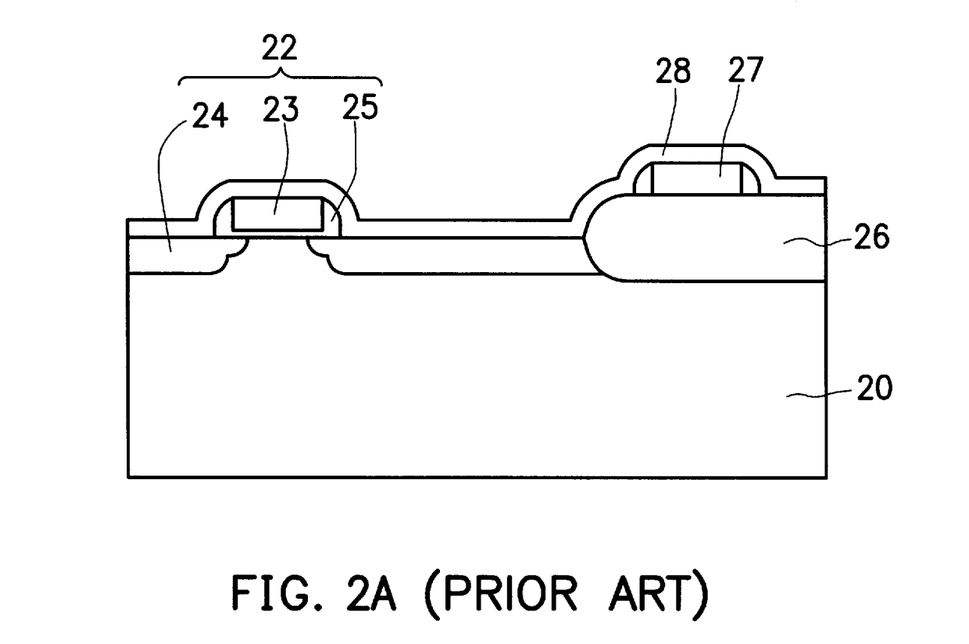
FIGS. 2A through 2K are a series of cross-sectional views showing the manufacturing flow of a stacked type DRAM capacitor according to Taiwan Patent No.: 262587.
Figure 2B:
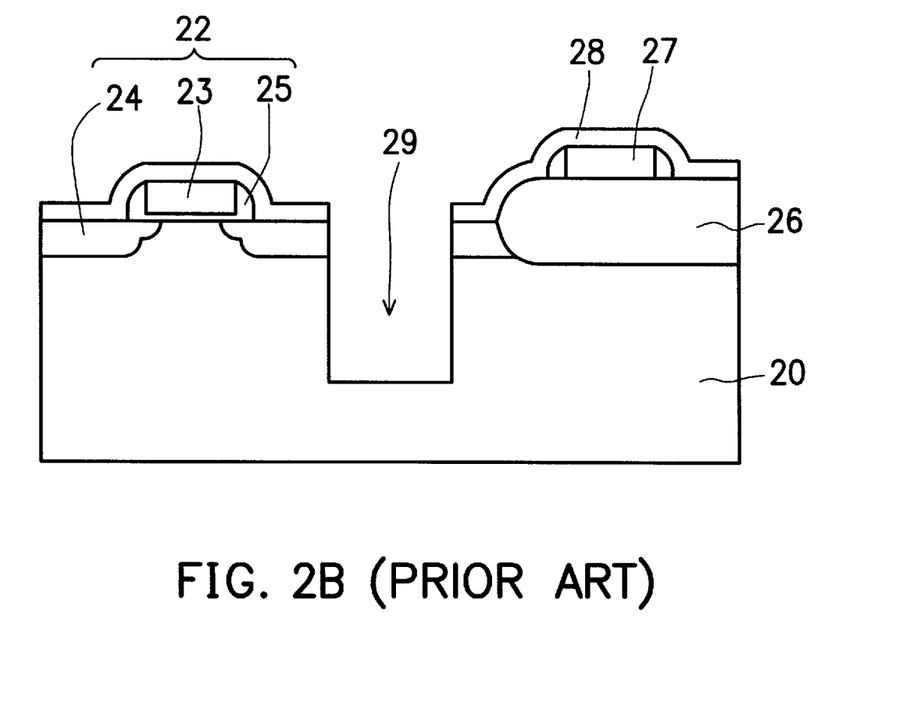
Figure 2C:
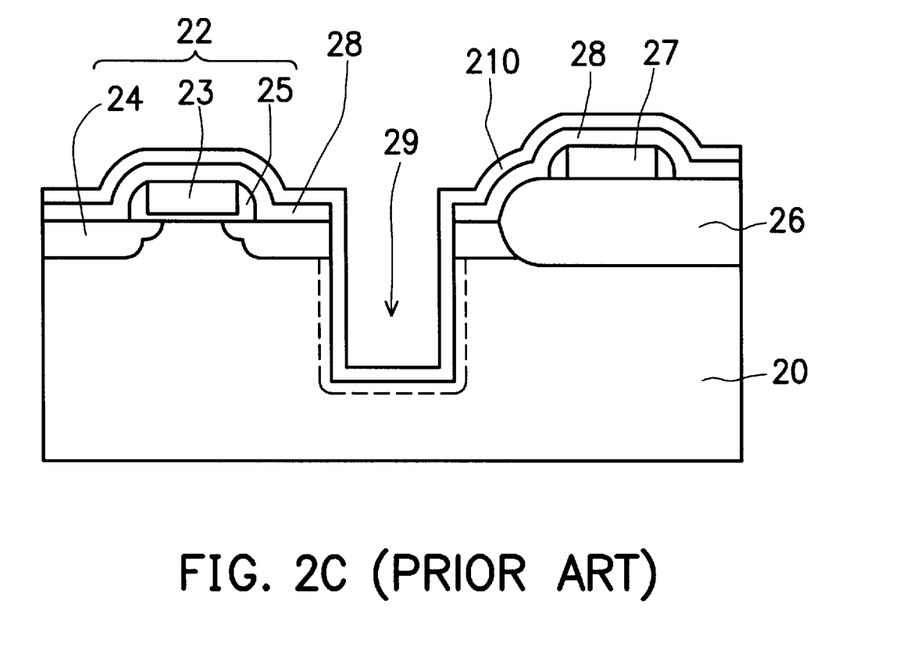

Referring next to FIG. 2C, a first conducting layer 210 is then formed over the first insulating layer 28 and the surfaces of the trench 29. For example, the conducting layer can be an impurity doped polysilicon layer having a thickness of about 500 Å to 1500 Å. An annealing operation is next performed so that heat is supplied to the doped ions causing diffusion and hence forming an expanded region as shown by the dash line of FIG. 2C.

Figure 2D:
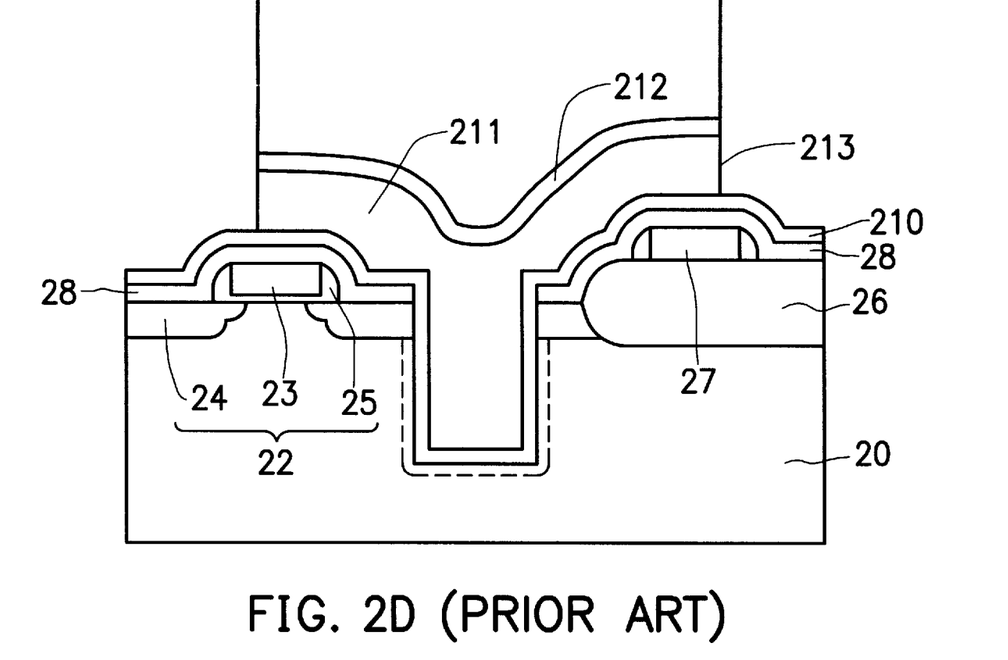

Referring next to FIG. 2D, a second insulating layer 211 is formed above the first conducting layer 210, for example, an oxide layer deposited to a thickness of about 4000 Å to 6000 Å. Subsequently, a first screen layer 212 is formed above the second insulating layer 211, for example, a silicon nitride layer deposited to a thickness of about 500 Å to 2000 Å. Thereafter, using photolithographic and etching processes, a pattern is defined on the second insulating layer 211 and the first screen layer 212 to mark out the boundary of the capacitor structure. This is followed by etching, for example, using a plasma etching method, to form sidewalls 213 on the periphery of the second insulating layer 211 and the first screen layer 212.

Figure 2E:
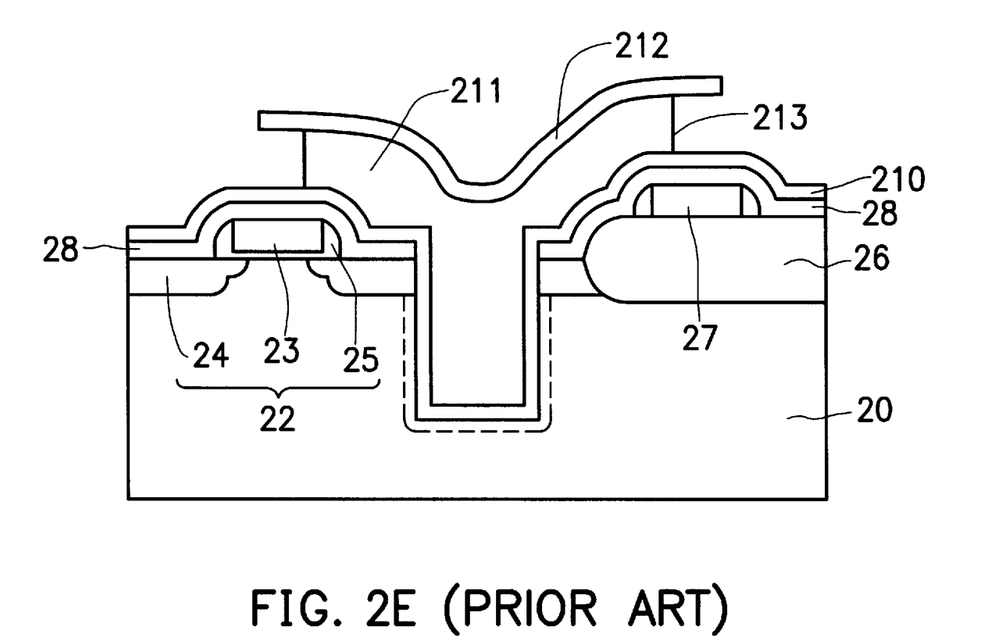

Referring next to FIG. 2E, in the subsequent step the sidewalls 213 of the second insulating layer 211 is isotropically etched, for example, using a buffered oxide etchant (BOE) having a concentration ratio of 6:1 of ammonium fluoride mixed with hydrofluoric acid.

Figure 2F:
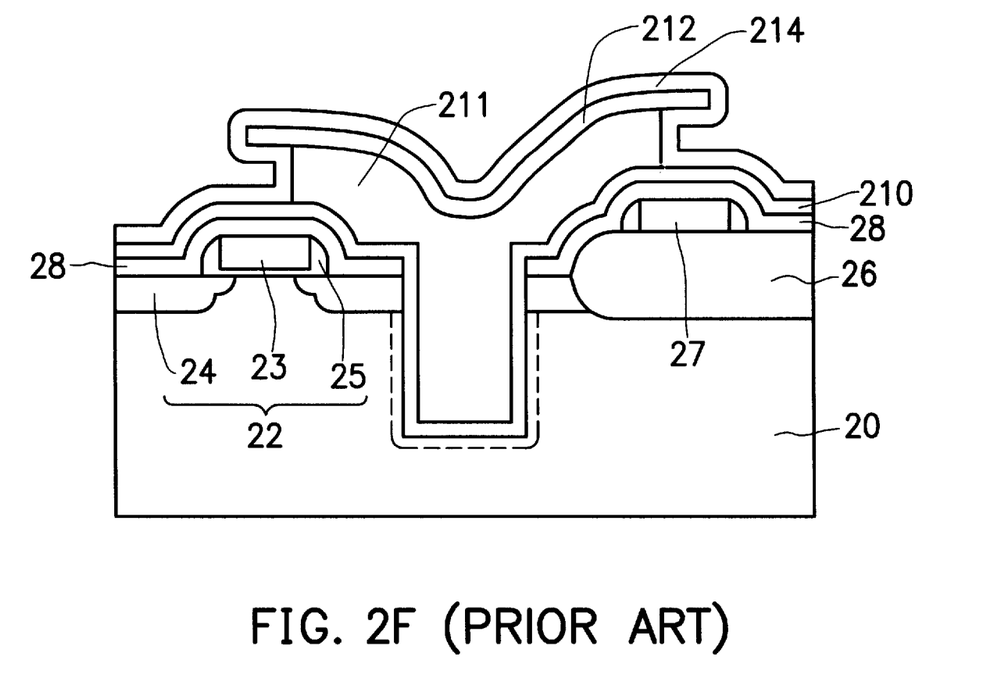

Referring next to FIG. 2F, a second conducting layer 214 is formed above the exposed surfaces of the first conducting layer 210, the second insulating layer 211 and the first screen layer 212. For example, the second conducting layer 214 can be an impurity doped polysilicon layer having a thickness of about 1000 Å to 3000 Å.

Figure 2G:
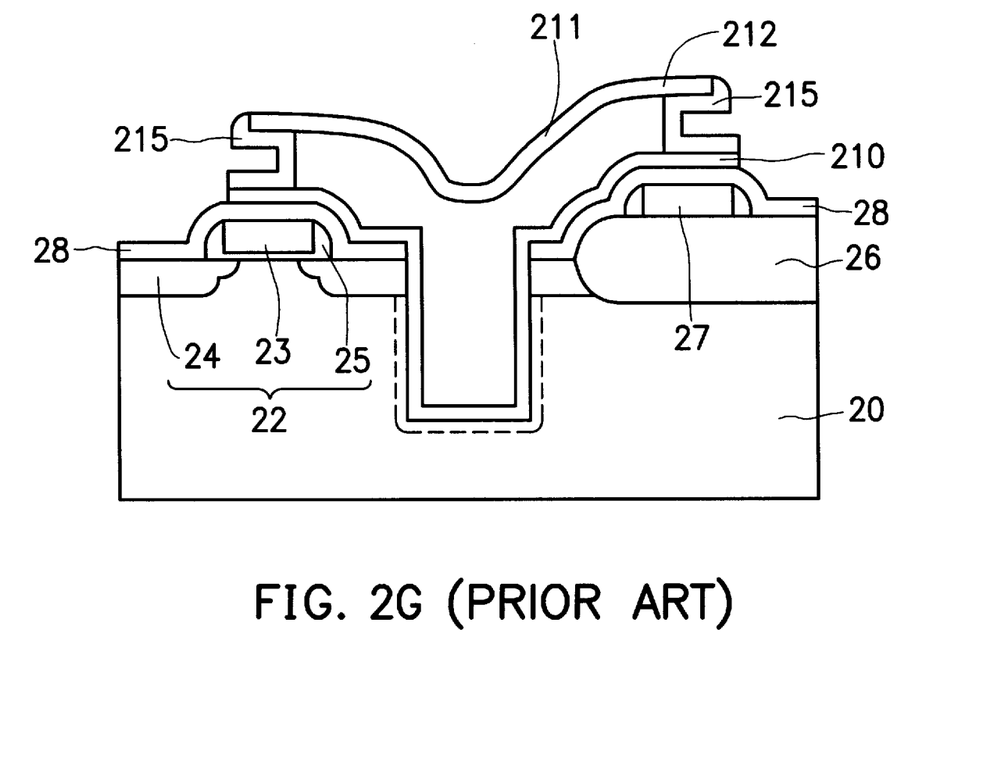

Referring next to FIG. 2G, in a subsequent step the second conducting layer 214 is etched back anisotropically, for example, using a plasma etching method, to form conducting spacers 215. The conducting spacers 215 are electrically connected with the first conducting layer 210 for expanding the overall surface area of the conducting layer.

Figure 2H:
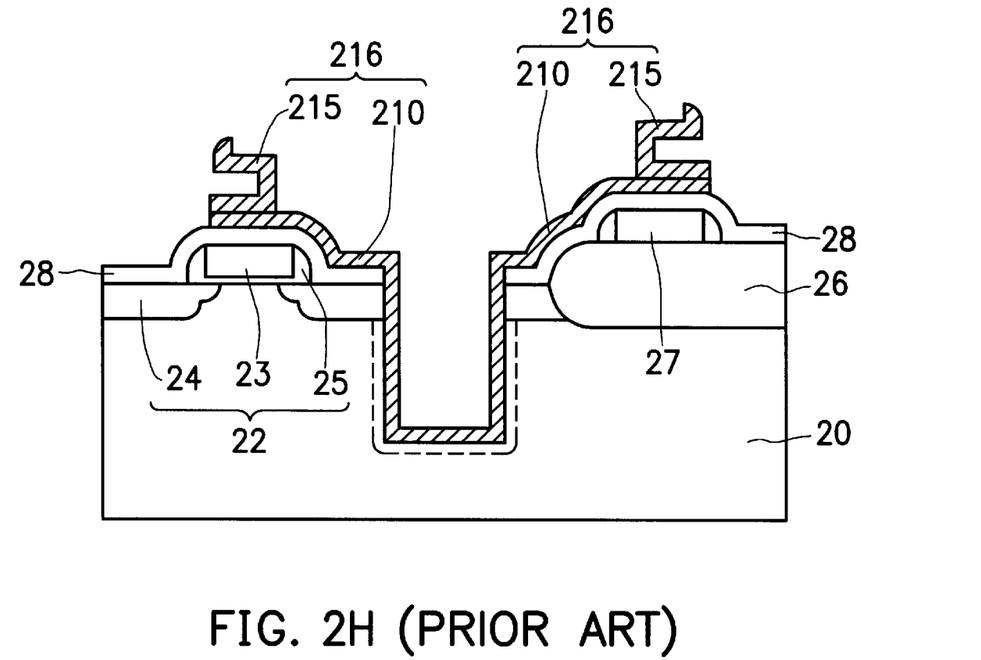

Referring next to FIG. 2H, the residual second insulating layer 211 and first screen layer 212 are removed leaving behind the first conducting layer 210 together with the conducting spacers 215 which become a lower electrode layer 216 of the capacitor structure. The lower electrode 216 can be created, for example, by isotropically etching away the first screen layer 212 and the second insulating layer 211 in sequence using phosphoric acid (H3PO4) and a buffered oxide etchant having a concentration ratio of 6:1.

Figure 2I:
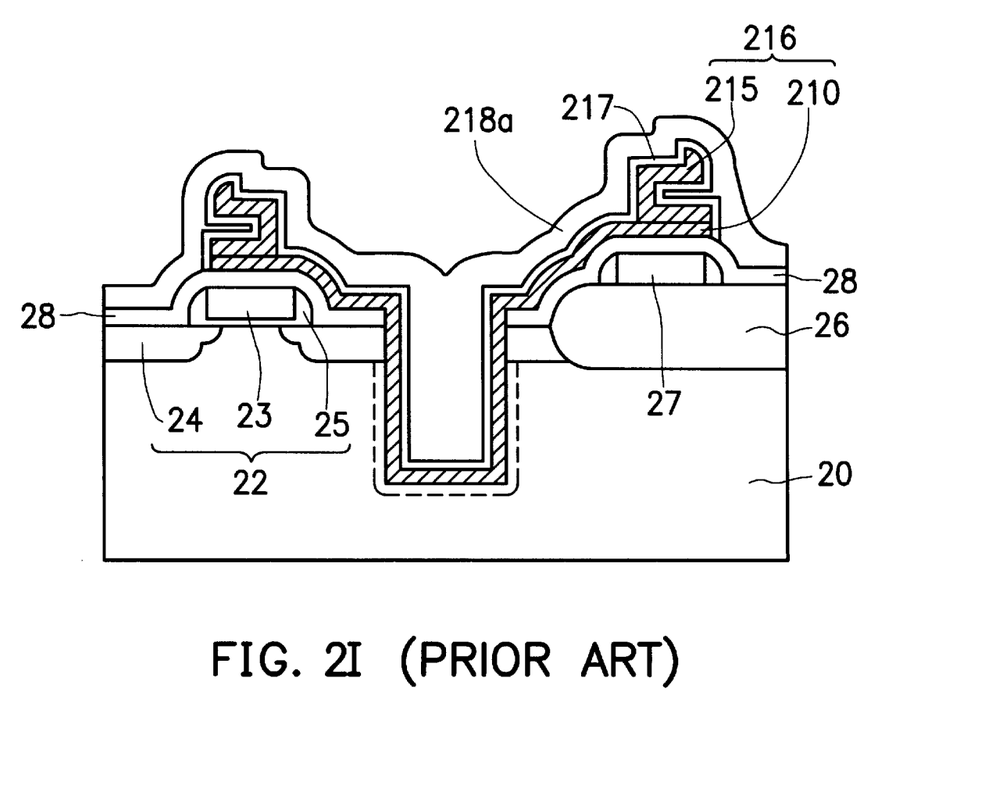

Referring next to FIG. 2I, a dielectric layer 217 is then formed on the surface of the lower electrode layer 216. The dielectric layer 217, for example, can be a silicon oxide/silicon nitride/silicon oxide (ONO) composite layer formed by first forming a silicon oxide layer through a heat growing method, then forming a silicon nitride layer above, and lastly performing a thermal oxidation operation to form a silicon oxide layer above the silicon nitride layer. Subsequently, a third conducting layer 218a is formed above the dielectric layer 217, for example, by depositing a polysilicon layer containing impurities.

Figure 2J:
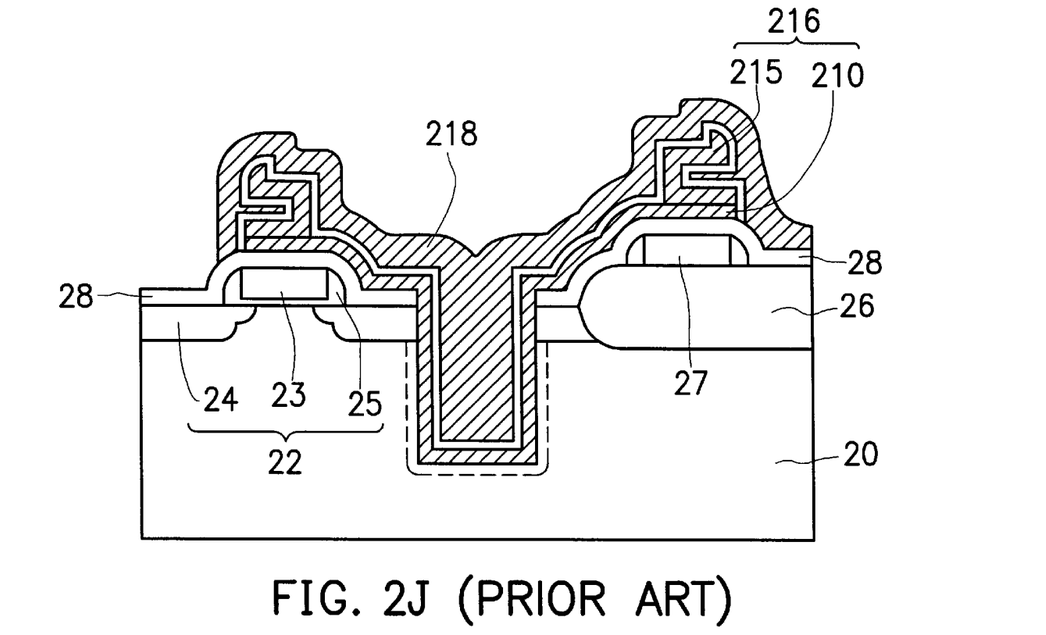
Figure 2K:
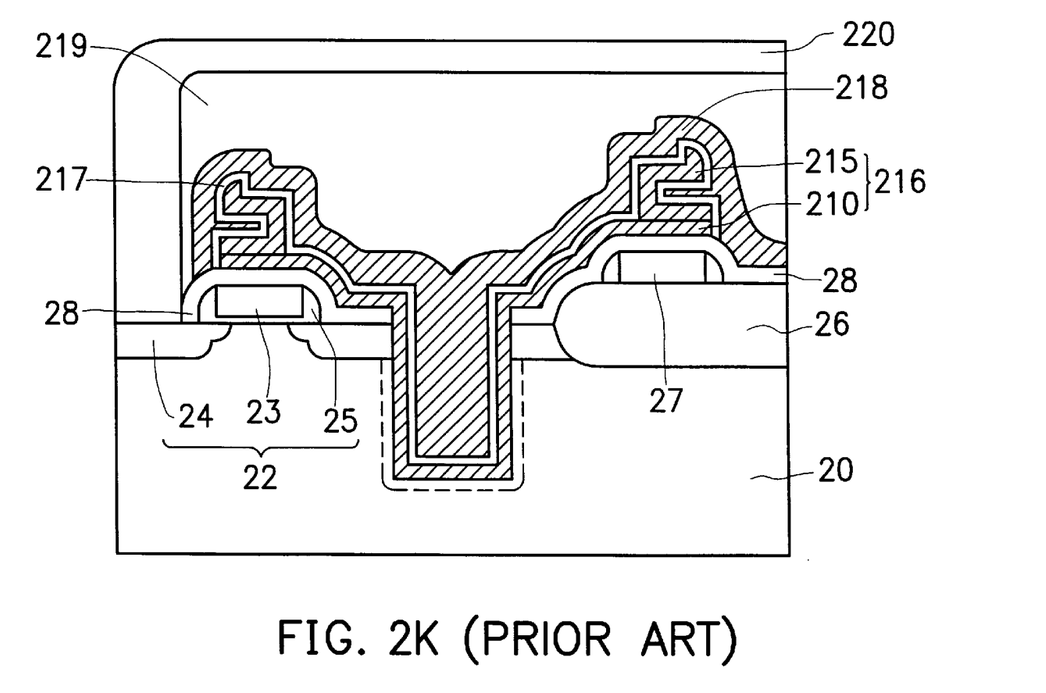

Referring next to FIG. 2J, the third conducting layer 218a is etched to form the boundary of the capacitor structure, for example, by photolithographic and plasma etching processes, thereby forming the upper electrode 218.

Lastly, referring to FIG. 2K, a metalization procedure is performed by first depositing a boro-phosphosilicate glass (BPSG) layer 219 on top of the upper electrode 218, then etching the layer to form contact windows, and finally sputtering a metal layer 220 on top of the boro-phosphosilicate glass layer 219.

Although the above stacked type DRAM capacitor structure is capable of increasing the surface area of the memory capacitor, the main disadvantages lies in its over-complicated manufacturing steps involved, which therefore greatly increases the production cost as well as production time.

SUMMARY OF THE INVENTION

It is therefore an object of this invention to provide a structure and manufacturing method for DRAM capacitors that eliminates the disadvantages of a conventional stacked type memory capacitor, by reducing the manufacturing steps while greatly increasing the surface area of the capacitor.

To achieve the above and other objects, a structure and manufacturing method for DRAM capacitors is provided having the following features:

A semiconductor substrate having a MOS transistor, a field oxide layer and a first conducting layer formed thereon is provided, wherein the MOS transistor includes a gate and source/drain regions. A first insulating layer is formed to cover the semiconductor substrate. A multi-layered stack comprised of at least one pair of a second insulating layer followed by a third insulating layer, is formed above the first insulating layer. An opening is formed through the multi-layered structure and the first insulating layer to expose the source/drain region below. Sidewalls of the second insulating layers are etched inside the opening to form a plurality of trenches, whereby an exposed surface area is increased. A second conducting layer is formed over the exposed surfaces of the aforementioned layers. A pattern is defined on the second conducting layer to form a lower electrode structure. The multi-layered structure is removed. A dielectric layer is formed over the lower electrode layer. A third conducting layer is formed over the dielectric layer. A pattern is defined on the third conducting layer to form the upper electrode structure.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

FIGS. 3A through 3F are a series of cross-sectional views outlining the manufacturing steps for a stacked-type DRAM capacitor according to one preferred embodiment of this invention.

Figure 3A:
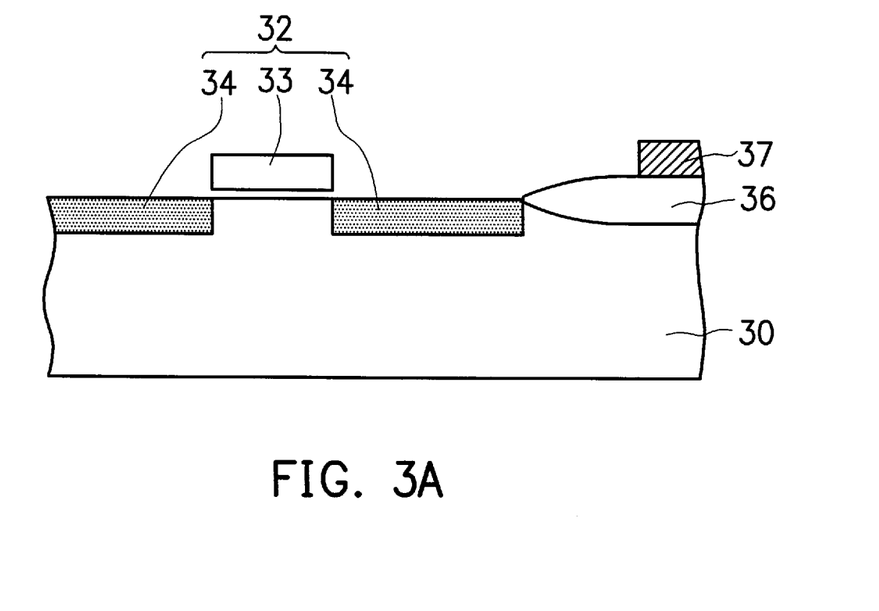
FIGS. 3A through 3F are a series of cross-sectional views outlining the manufacturing procedure for a stacked type DRAM capacitor according to one preferred embodiment of this invention.

First, referring to FIG. 3A, a semiconductor substrate 30 having a MOS transistor 32, a field oxide layer 36 and a first conducting layer 37 already formed thereon is provided. The MOS transistor 32 is comprised of a gate 33 and source/drain regions 34.

Figure 3B:
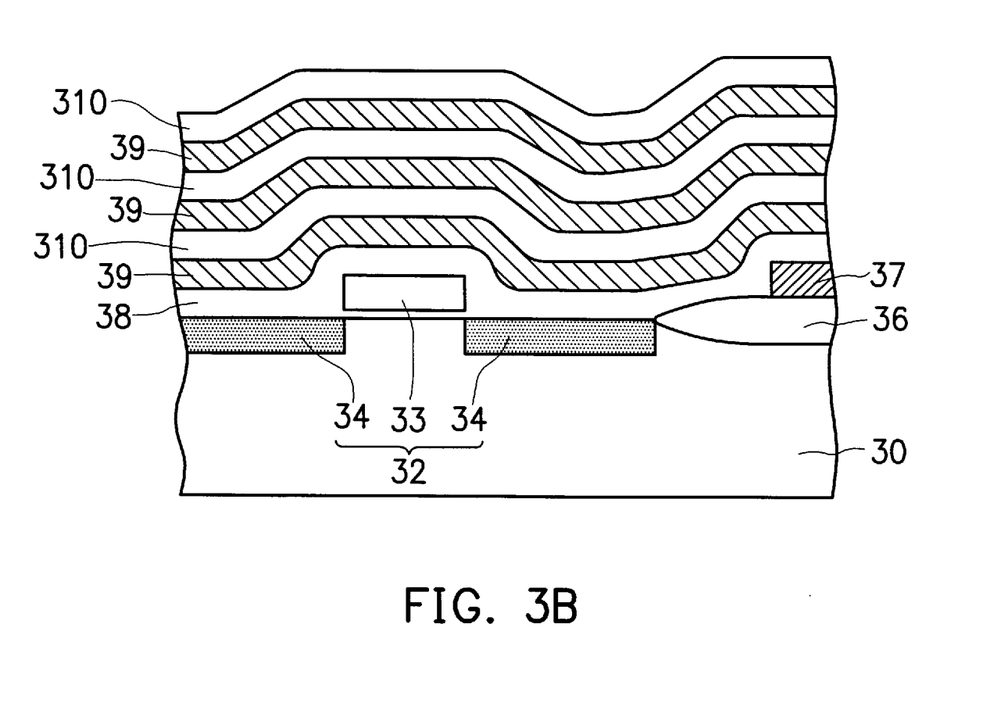

Referring next to FIG. 3B, a first insulating layer 38, preferably a silicon dioxide layer with a thickness of about 3000 Å to 6000 Å is deposited above the semiconductor substrate 30 using tetra-ethyl-ortho-silicate (TEOS) as the reactive gas. Thereafter, a multi-layered stack composed of an alternately deposited second insulating layer 39 followed by a third insulating layer 310 is formed above the first insulating layer 38. Layers 39 and 310 form a pair, and the multi-layered stack includes one or more of such pairs. The second insulating layer 39 is preferably a nitride layer with a thickness of about 3000 Å to 6000 Å while the third insulating layer 310 is preferably a silicon dioxide layer with a thickness of about 3000 Å to 6000 Å.

Figure 3C:
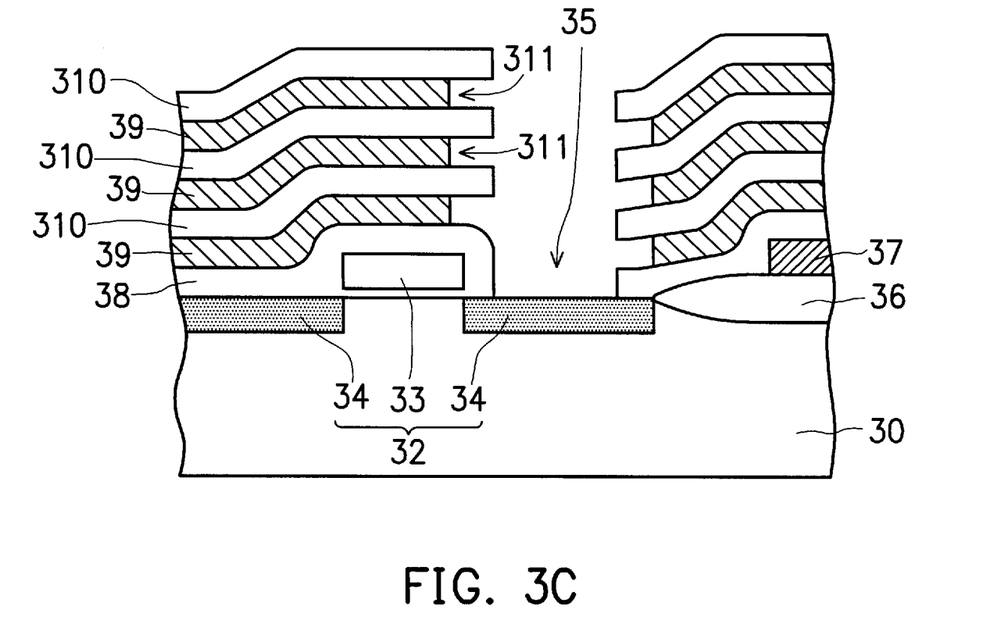

Referring next to FIG. 3C, in a subsequent step, an anisotropic dry etching method is used to etch the third insulating layers 310, the second insulating layers 39, and the first insulating layer 38 in sequence forming an opening 35 that exposes one of the source/drain regions 34 below. Next, using hot phosphoric acid (H3PO4) as the etchant, a wet etching method is employed to remove part of the second insulating layers 39 forming a plurality of trenches 311, having depths that extend in the horizontal direction, i.e., essentially parallel to a surface of the source/drain regions, on the sidewalls of the opening 35.

Figure 3D:
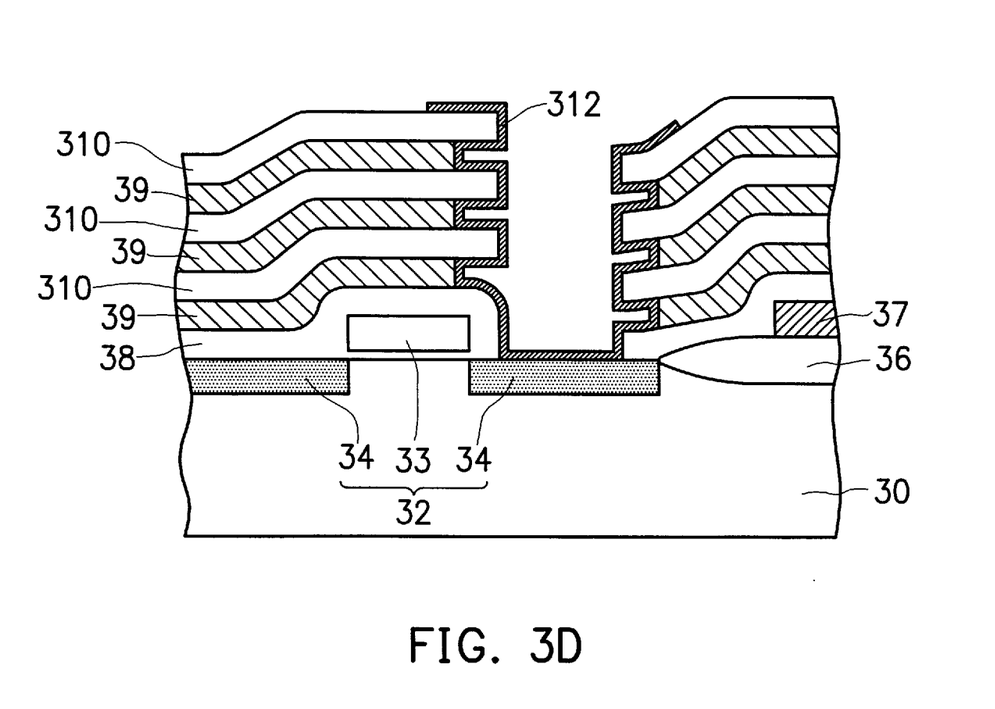

Referring next to FIG. 3D, subsequently a second conducting layer 312, for example, a doped polysilicon layer is deposited within opening 35 and above the exposed surfaces of various layers 39, 310. A chemical vapor deposition method for increasing the electrical conductivity of the layer can be used to embed the layer with doping ions. The thickness of the second conducting layer 312 is about 500 Å to 2000 Å. Thereafter, photolithographic and etching processes are used to define a pattern on the second conducting layer 312, thereby forming a boundary of the lower electrode layer 312 of the capacitor structure. As shown in the Figure, layer 312 extends in a direction away from the source/drain region in an essentially crenellated manner, i.e., its profile is formed of a series of interconnected, oppositely positioned square teeth.

Figure 3E:
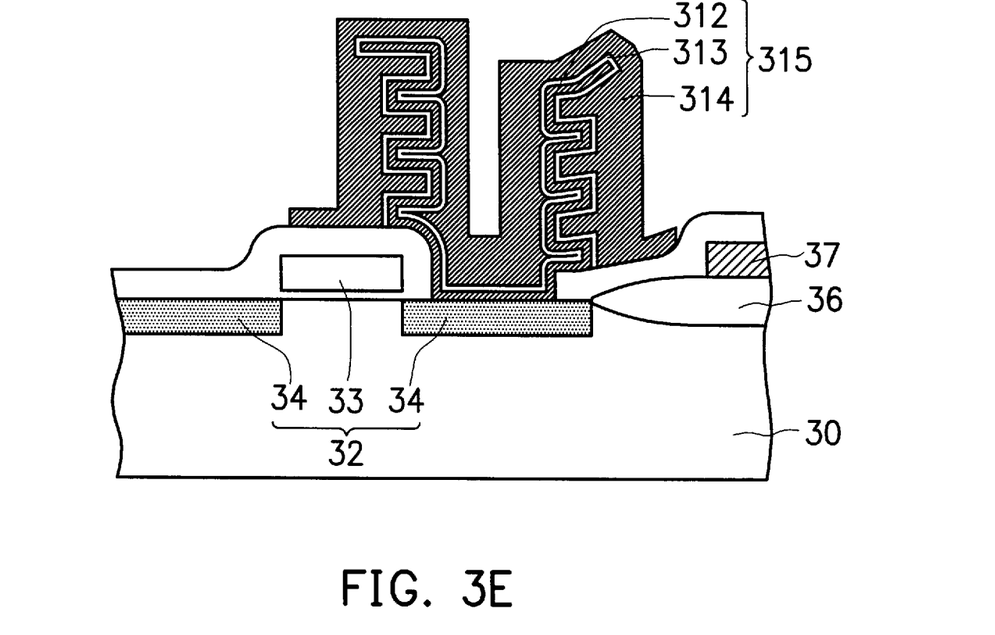

Referring next to FIG. 3E, the residual second insulating layers 39 and the third insulating layers 310 are removed leaving behind the lower electrode layer 312. Then, a dielectric layer 313, for example, a silicon oxide/silicon nitride/silicon oxide (ONO) composite layer, is deposited above the lower electrode layer 312. The ONO composite layer can be formed by first heat growing a silicon oxide layer, then forming a silicon nitride layer on top, and finally performing a thermal oxidation process to form a silicon oxide layer above the silicon nitride layer. The thickness of the dielectric layer 313 is normally smaller than the thickness of the lower electrode layer 312, and in general should not be greater than about 100 Å.

Next, a third conducting layer 314, for example, a doped polysilicon layer, is deposited above the dielectric layer 313. A chemical vapor deposition method for increasing the electrical conductivity of the layer can be used to embed the layer with doping ions. The thickness of the third conducting layer 314 is about 1000 Å to 3000 Å. Thereafter, photolithographic and etching processes are used to define a pattern on the third conducting layer 314 thereby forming a boundary of the upper electrode layer 314 of the capacitor structure. Hence, the lower electrode layer 312, the dielectric layer 313 and the upper electrode layer 314 together constitute a stacked type capacitor 315 structure for the DRAM cell.

Figure 3F:
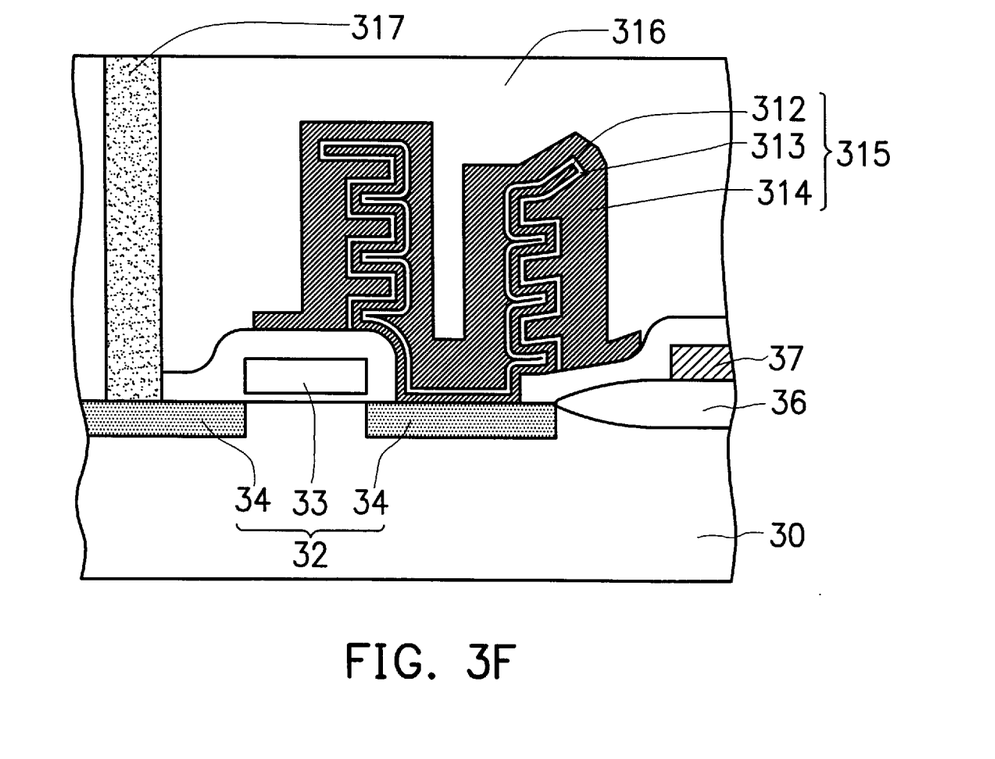

Lastly, and referring to FIG. 3F, subsequent end processes are performed, such as depositing a fourth insulating layer 316 followed by the formation of metal interconnect wiring 317 in order to complete the DRAM cell structure according to this invention.

FIGS. 4A through 4F are a series of cross-sectional views outlining the manufacturing steps for a DRAM capacitor according to a second preferred embodiment of this invention. The capacitor has a composite structure which is a parallel combination of a trench type capacitor and a stacked type capacitor.

Figure 4A:
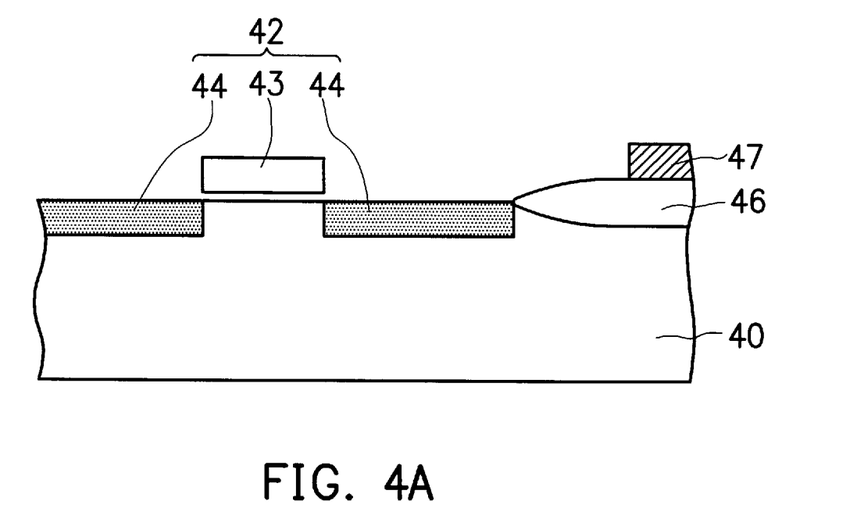
FIGS. 4A through 4F are a series of cross-sectional views outlining the manufacturing procedure for a DRAM capacitor according to a second preferred embodiment of this invention.

First, referring to FIG. 4A, a semiconductor substrate 40 having a MOS transistor 42, a field oxide layer 46 and a first conducting layer 47 already formed thereon is provided. The MOS transistor 42 is comprised of a gate 43 and source/drain regions 44.

Figure 4B:
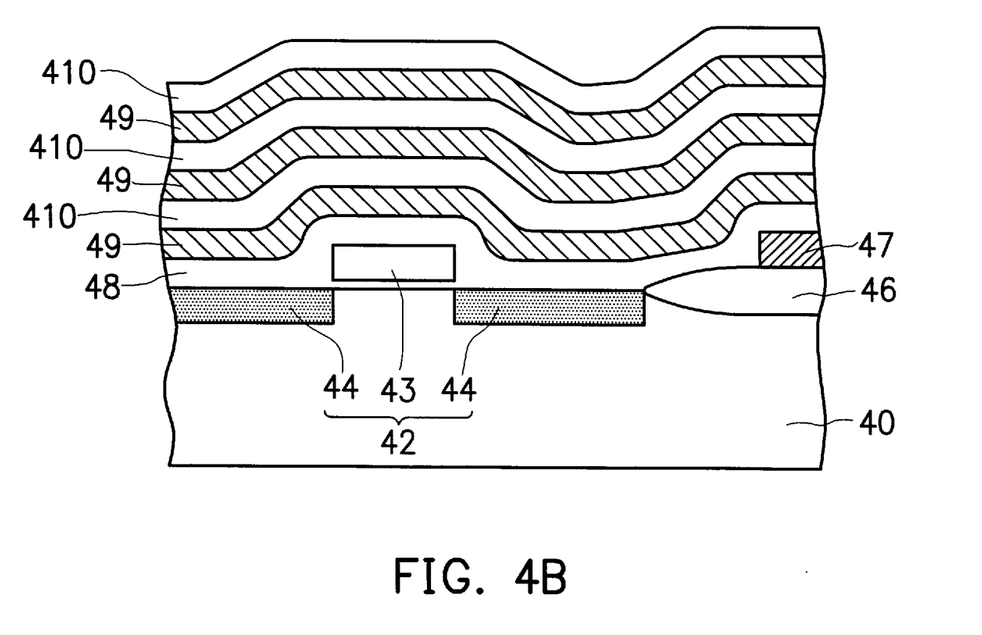

Referring next to FIG. 4B, a first insulating layer 48, preferably a silicon dioxide layer with a thickness of about 3000 Å to 6000 Å is deposited above the semiconductor substrate 40. Thereafter, a multi-layered stack, comprised of at least one pair composed of an alternately deposited second insulating layer 49 followed by a third insulating layer 410, is formed above the first insulating layer 48. The second insulating layer 49 is preferably a nitride layer with a thickness of about 3000 Å to 6000 Å, while the third insulating layer 410 is preferably a silicon dioxide layer with a thickness of about 3000 Å to 6000 Å.

Figure 4C:
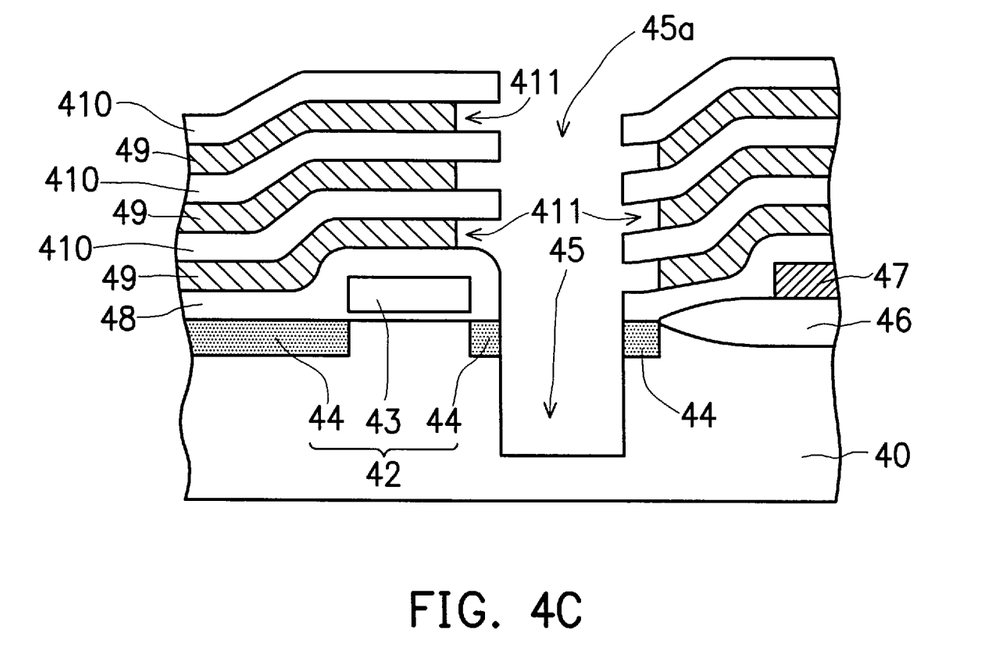

Referring next to FIG. 4C, in a subsequent step, an anisotropic dry etching method is used to etch the third insulating layers 410, the second insulating layers 49, and the first insulating layer 48 in sequence thereby forming an opening 45a. Then, the etching is continued down through the source/drain region 44 and into the semiconductor substrate 40 thereby forming a first trench 45. Thereafter, using hot phosphoric acid as the etchant, a wet etching method is used to remove part of the second insulating layer 49, thereby forming a number of second trenches 411, each having a depth extending in a horizontal direction, on the sidewalls of the opening 45a.

Figure 4D:
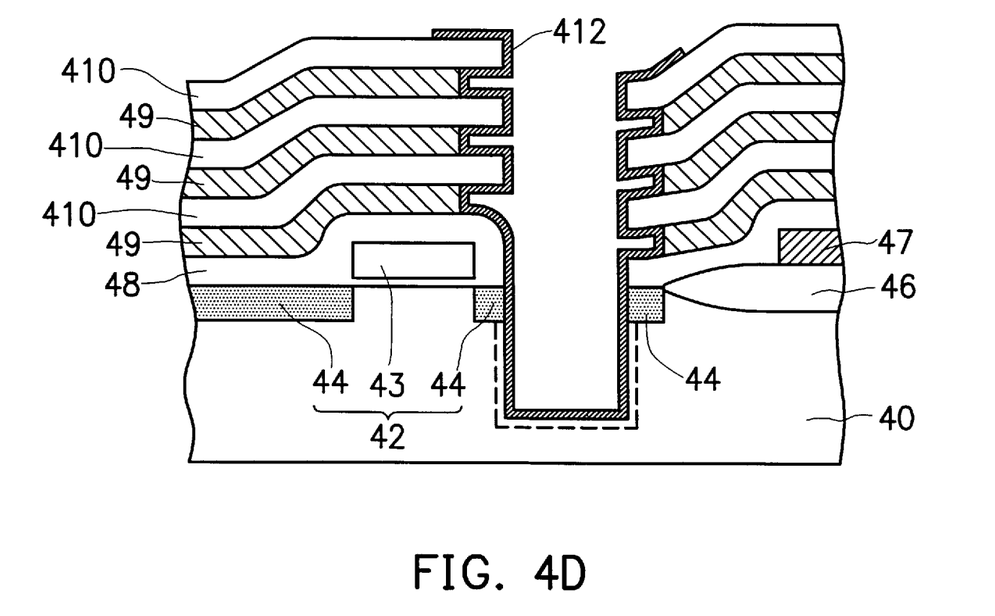

Referring next to FIG. 4D, subsequently a second conducting layer 412, for example, a doped polysilicon layer is deposited within opening 45a and above the exposed surfaces of various layers 49, 410. A chemical vapor deposition method for increasing the electrical conductivity of the layer can be used to embed the layer with doping ions. The thickness of the second conducting layer 412 is about 500 Å to 2000 Å. Thereafter, photolithographic and etching processes are used to define a pattern on the second conducting layer thereby forming a lower electrode layer 412 of the capacitor structure. An annealing operation is then performed to activate the ions already doped inside the lower electrode layer 412 causing diffusion and hence forming an expanded region as shown by the dashed line in FIG. 4D.

Figure 4E:
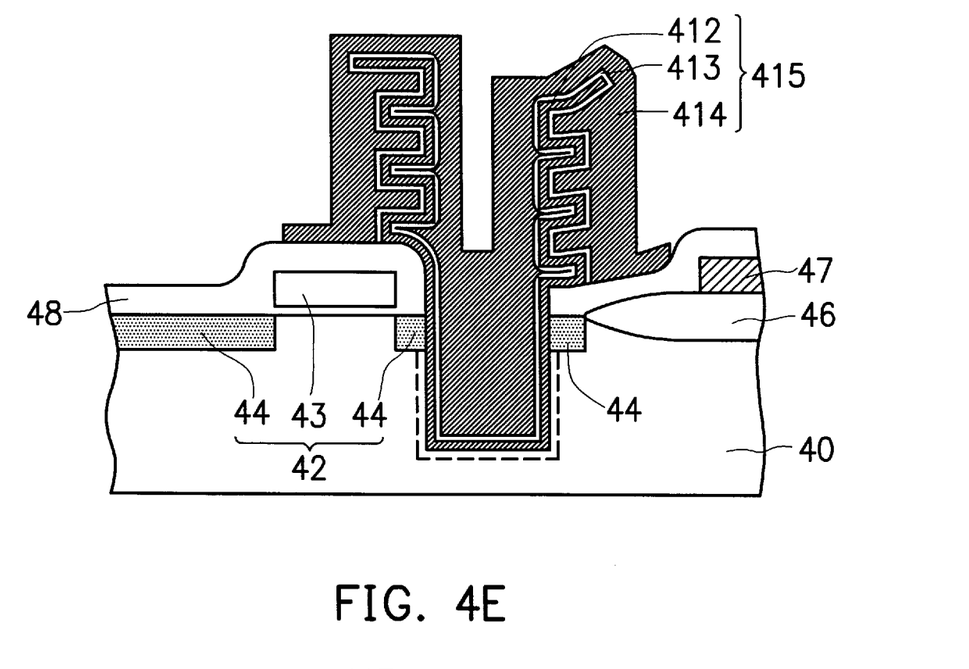

Referring next to FIG. 4E, the residual second insulating layers 49 and the third insulating layers 410 are removed leaving behind the lower electrode layer 412. Then, a dielectric layer 413, for example, a silicon oxide/silicon nitride/silicon oxide (ONO) composite layer, is deposited above the lower electrode layer 412. The ONO composite layer can be formed by first heat growing a silicon oxide layer, then forming a silicon nitride layer on top, and finally performing a thermal oxidation process to form a silicon oxide layer above the silicon nitride layer. The thickness of the dielectric layer 413 is normally smaller than the thickness of the lower electrode layer 412, and in general should not be greater than about 100 Å.

Next, a third conducting layer 414, for example, a doped polysilicon layer, is deposited above the dielectric layer 413. A chemical vapor deposition method for increasing the electrical conductivity of the layer can be used by embedding the layer with doping ions. The thickness of the third conducting layer 414 is about 1000 Å to 3000 Å. Thereafter, photolithographic and etching processes are used to define a pattern on the third conducting layer 414 thereby forming a boundary of the upper electrode layer 414 of the capacitor structure. Hence, the lower electrode layer 412, the dielectric layer 413 and the upper electrode layer 414 together constitute a stacked type capacitor 415 structure for the DRAM cell.

Figure 4F:
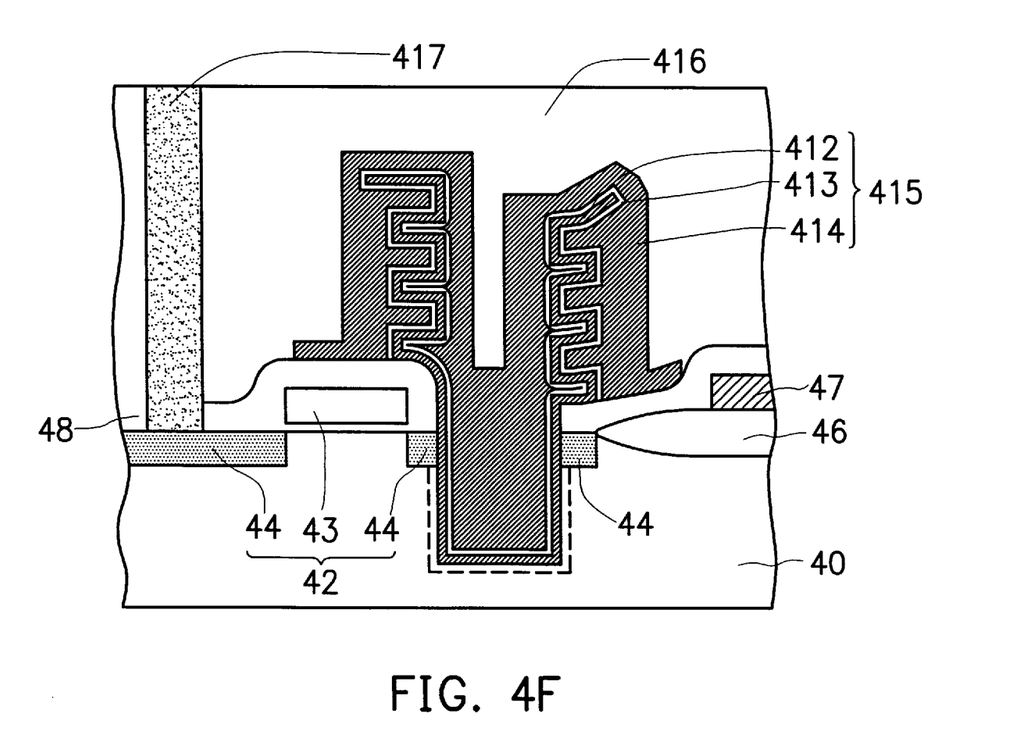

Lastly, and referring to FIG. 4F, subsequent end processes are performed, such as depositing a fourth insulating layer 416 followed by the formation of metal interconnect wiring 417 in order to complete the DRAM cell structure according to this invention.

As a summary, the manufacturing method for a DRAM capacitor according to this invention has the following advantages:

(1) The multi-layered structure formed by alternately depositing a second insulating layer 39 (49) and then a third insulating layer 310 (410) repeatedly can greatly increase the surface area of the capacitor, thereby greatly increasing the amount of charges capable of being stored in the capacitor.

(2) The manufacturing method for producing the capacitor structure in this invention has fewer steps than other conventional capacitor structures, and therefore can lower both production cost and production time.

(3) Trench-type as well as stacked-type capacitors can be used together in the same capacitor design according to this invention. Such flexibility allows a tremendous increase in the surface area of the capacitor and hence its charge storage capacity.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A manufacturing method for stacked-type DRAM capacitors, comprising:

providing a semiconductor substrate having a MOS transistor, a field oxide layer and a first conducting layer formed thereon, the MOS transistor including a gate and source/drain regions;

covering the semiconductor with a first insulating layer;

forming a multi-layered stack above the first insulating layer, and being comprised of at least a pair of an alternately formed second insulating layer followed by a third insulating layer;

forming an opening through the multi-layered stack and the first insulating layer and exposing a selected source/drain region;

etching the second insulating layer and forming a plurality of trenches on respective sidewalls of the opening;

forming a second conducting layer within the opening and over any exposed surfaces therein;

forming a lower electrode layer by defining a pattern on the second conducting layer;

forming a dielectric layer over the lower electrode layer;

forming a third conducting layer over the dielectric layer; and forming an upper electrode structure by defining a pattern on the third conducting layer.

2. The method according to claim 1, wherein said covering the semiconductor with a first insulating layer includes forming the first insulating layer using chemical vapor deposition.

3. The method according to claim 1, wherein said forming a multi-layered stack includes forming the second insulating layer using chemical vapor deposition.

4. The method according to claim 1, wherein said forming a multi-layered stack includes forming the third insulating layer using chemical vapor deposition.

5. The method according to claim 1, wherein said forming an opening includes using dry etching.

6. The method according to claim 1, wherein said etching the second insulating layer includes wet etching using hot phosphoric acid as the etchant.

7. The method according to claim 1, wherein said forming a second conducting layer includes chemical vapor deposition, and doping the second conducting layer with ions to increase its electrical conductivity.

8. The method according to claim 1, wherein said forming a dielectric layer includes forming a silicon oxide/silicon nitride/silicon oxide composite layer, by first heat growing a silicon oxide layer, then forming a silicon nitride layer on top of the silicon oxide layer, and finally performing a thermal oxidation operation to form a further silicon oxide layer above the silicon nitride layer.

9. The method according to claim 1, wherein said forming the third conducting layer includes using chemical vapor deposition, and doping the third conducting layer to increase its electrical conductivity.

10. The method according to claim 1, further comprising removing the multi-layered stack after said forming a lower electrode layer and before said forming a dielectric layer.

11. A manufacturing method for DRAM capacitors, comprising:

providing a semiconductor substrate having a MOS transistor, a field oxide layer and a first conducting layer formed thereon, the MOS transistor including a gate and source/drain regions;

covering the semiconductor with a first insulating layer;

forming a multi-layered stack above the first insulating layer, and being comprised of at least a pair of an alternately formed second insulating layer followed by a third insulating layer;

etching the third insulating layer, the second insulating layer, and the first insulating layer to form an opening;

etching below the opening to form a first trench in a selected source/drain region;

etching the second insulating layer and forming a plurality of second trenches on respective sidewalls of the opening;

forming a second conducting layer within the opening and first trench and over any exposed surfaces therein;

forming a lower electrode layer by defining a pattern on the second conducting layer;

forming a dielectric layer over the lower electrode layer;

forming a third conducting layer over the dielectric layer; and forming an upper electrode structure by defining a pattern on the third conducting layer.

* * * * *